US006954913B2

(12) United States Patent
Gauthier et al.

(10) Patent No.: US 6,954,913 B2
(45) Date of Patent: Oct. 11, 2005

(54) SYSTEM AND METHOD FOR IN-SITU SIGNAL DELAY MEASUREMENT FOR A MICROPROCESSOR

(75) Inventors: Claude R. Gauthier, Cupertino, CA (US); Pradeep Trivedi, Sunnyvale, CA (US)

(73) Assignee: Sun Microsystems Inc., Santa Clara, CA (US)

( * ) Notice: Subject to any disclaimer, the term of this patent is extended or adjusted under 35 U.S.C. 154(b) by 109 days.

(21) Appl. No.: 10/407,531

(22) Filed: Apr. 3, 2003

(65) Prior Publication Data

US 2004/0196069 A1 Oct. 7, 2004

(51) Int. Cl.[7] .............................................. G06F 17/50
(52) U.S. Cl. .............................................. 716/4; 716/6
(58) Field of Search ..................... 716/4, 6; 713/400, 713/401, 500–503; 327/158

(56) References Cited

U.S. PATENT DOCUMENTS

| | | | | |
|---|---|---|---|---|
| 5,296,748 A | * | 3/1994 | Wicklund et al. ........... 327/565 |
| 5,351,000 A | | 9/1994 | Farwell | |
| 5,787,092 A | | 7/1998 | Jaynes et al. | |
| 5,838,578 A | * | 11/1998 | Pippin .......................... 716/4 |
| 5,936,565 A | * | 8/1999 | Bogdan ...................... 341/152 |
| 5,959,871 A | * | 9/1999 | Pierzchala et al. ............. 703/4 |
| 6,311,313 B1 | * | 10/2001 | Camporese et al. ........... 716/6 |
| 6,539,072 B1 | * | 3/2003 | Donnelly et al. ........... 375/371 |
| 6,631,503 B2 | * | 10/2003 | Hsu et al. ...................... 716/4 |
| 6,636,979 B1 | * | 10/2003 | Reddy et al. ................ 713/503 |
| 6,646,484 B2 | * | 11/2003 | Ito .............................. 327/158 |
| 2001/0054171 A1 | * | 12/2001 | Furumoto et al. .............. 716/6 |
| 2002/0021158 A1 | | 2/2002 | Mullarkey | |
| 2002/0026610 A1 | | 2/2002 | Merritt | |
| 2003/0076143 A1 | * | 4/2003 | Nishimura et al. .......... 327/158 |
| 2003/0135836 A1 | * | 7/2003 | Chang et al. ................. 716/11 |

OTHER PUBLICATIONS

European Search Report.
Josep Altet et al., "Analysis of the Feasibility of Dynamic Thermal Testing in Digital Circuits", *IEEE*, 1997 p. 149–154.
Excerpt p. 99, Microelectronic Circuits, 3$^{rd}$ Edition, ISBN–0–03–051648–X.

* cited by examiner

*Primary Examiner*—Vuthe Siek
*Assistant Examiner*—Magid Y. Dimyan
(74) *Attorney, Agent, or Firm*—Martine Penilla & Gencarella, LLP

(57) ABSTRACT

A system and method of determining an in-situ signal path delay on an integrated circuit. The system and method includes inputting a first signal to a first input node of a first signal path and inputting a second signal to a second input node of a reference signal path. A phase of the first signal output from a first output node of the first signal path is compared to a phase of the second signal output from a second output node of the reference signal path. A phase error signal is output.

20 Claims, 7 Drawing Sheets

SYSTEM AND METHOD FOR IN-SITU SIGNAL DELAY MEASUREMENT FOR A MICROPROCESSOR

BACKGROUND OF THE INVENTION

1. Field of the Invention

The present invention relates generally to measuring signal path delays in an integrated circuit, and more particularly, to in-situ methods and systems for measuring signal path delay in an integrated circuit.

2. Description of the Related Art

Integrated circuits such as microprocessors include many signal paths. Each signal path has a signal delay that typically delays the signal being transmitted through the signal path. The signal path delay may be relatively very small or relatively quite large. The magnitude of the signal path delay is a function of many aspects of the signal path including a number of logic steps in the signal path, a process-type of each of the devices in the signal path, and a physical length of the signal path.

In an ideal integrated circuit, all of the signal paths would have the same signal path delay so that a clock signal can be accurately timed so as to detect the correct signal level at the correct time as the signal passes through the signal path. In a typical integrated circuit, the signal paths do not have the same delay and therefore the clock must be delayed by a selected time or number of degrees of the clock cycle (i.e. phase shifted). The clock delay is referred to as a guard band. An ideal guard band can very narrow, or even have a zero width, if all the signal paths have the same signal path delay. Conversely, if the signal path delays are different, then the guard band must be sufficiently wide to encompass the greatest signal path delay.

By way of example, FIG. 1A shows a typical microprocessor 120. The microprocessor 120 has four signal paths 122, 124, 126 and 128 between respective regions A and B, A and C, A and D, and A and E of the microprocessor. Each of the signal paths 122, 124, 126 and 128 has respective signal path delays of 0.8 ns, 0.2 ns, 0.4 ns and 0.4 ns. Therefore, the minimum signal path delay is 0.2 ns in signal path 124 and the maximum signal path delay is 0.8 ns in signal path 122. Therefore, the guard band for the clock must be at least 0.8 ns so that the clock signal does not transition (i.e., switch), so as to sample the signal levels on each of the signal paths 122, 124, 126 and 128 until all of the signal paths will have switched in the corresponding cycle of the respective signals.

As the guard band grows larger, the maximum frequency of the clock and the signal paths 122, 124, 126 and 128 must be reduced. By way of example, a 0.8 ns guard band limits the clock frequency to less than 1.25 GHz because 0.8 ns is equal to the wavelength of a clock signal at 1.25 GHz.

A semiconductor manufacturing process determines the process-type of a semiconductor device. The semiconductor manufacturing process can produce semiconductor devices operating across a performance range due to even slight variations in the semiconductor manufacturing processes. The performance range can occur between devices that are formed on different semiconductor wafers or devices that are formed on different parts of a single wafer or even devices contained in different parts of a single integrated circuit. By way of example, in a single manufacturing process, a first sense amplifier formed on a first semiconductor wafer may have a switching speed of about 20 percent faster than a second sense amplifier formed on a second semiconductor wafer. Similarly, a first sense amplifier formed on a first portion of a semiconductor wafer may have a switching speed of about 5 percent faster than a second sense amplifier formed on a second portion of the same semiconductor wafer. Typically sense amplifiers and other semiconductor devices are tested during the production process to determine if the component has a fast, slow or typical switching speed and the corresponding process-type classifications of a fast-type, a slow-type or a typical-type.

Unfortunately, the slow-type devices are often intermixed with the typical-type devices and the fast-type devices as described in FIG. 1A above. FIG. 1B is a schematic of the signal path 124. The signal path 124 includes a flip-flop 142 coupled through multiple logic stages 144, 146, 148 to a sense amplifier 150. The sense amplifier 150 can be a slow-type sense amplifier (i.e., has a slower than typical switching speed) and therefore signal path 124 is a slow-type signal path. Signal path 122 is a fast-type signal path (e.g., includes fast-type components). Signal paths 126 and 128 are typical-type signal paths (e.g., include typical-type components) but include different numbers of devices (e.g., logic gates, sense amplifiers, etc). As a result, each of the signal paths 122, 124, 126 and 128 has a different signal path delay.

However due to various dynamic factors (e.g., circuit temperature, circuit degradation over time, etc.) the signal path delays on each of the signal paths 122, 124, 126 and 128 can vary over time. Typically, this variation is projected and added to the required guard band. This further broadens the guard band and further reduces the maximum frequency of the clock signal.

Other types of signal paths such as between an I/O buffer and a register can also have respective signal path delays. By way of example, an I/O buffer can include many parallel signal paths (e.g., 128-bit I/O buffer can have 128 signal paths) between each I/O amplifier and the corresponding input register. As described above, each of the signal paths in the I/O buffer can have a different time delay, thereby requiring a corresponding clock guard band.

Signal path delays are typically measured using various testing circuits that are externally attached to the completed integrated circuit. However, the external testing circuits are cumbersome and cannot be used while the integrated circuit is in use to determine an actual signal path delay dynamically, while each of the signal paths are in use. Once the signal path delays are measured, a guard band is calculated as described above and is typically stored on the integrated circuit such as through fuses or other storage methods. In use, when the integrated circuit is initially activated (i.e., powered-up), the guard band for the clock is retrieved and the clock is then delayed accordingly. The external signal path delay testing circuit also cannot accurately measure the signal path delay as the testing circuit can also have some inherent delay.

In view of the foregoing, there is a need for a system and method for measuring the signal path delay that is included within the integrated circuit.

SUMMARY OF THE INVENTION

Broadly speaking, the present invention fills these needs by providing a system and method of measuring the signal path delay in-situ (i.e., within the integrated circuit). It should be appreciated that the present invention can be implemented in numerous ways, including as a process, an apparatus, a system, computer readable media, or a device.

Several inventive embodiments of the present invention are described below.

One embodiment includes a method of determining an in-situ signal path delay on an integrated circuit. The method includes inputting a first signal to a first input node of a first signal path and inputting a second signal to a second input node of a reference signal path. A phase of the first signal output from a first output node of the first signal path is compared to a phase of the second signal output from a second output node of the reference signal path. A phase error signal is output.

Comparing the phase of the first signal output from the first output node of the first signal path and the phase of the second signal output from the second output node of the reference signal path can include comparing a phase of the voltage of the first signal and a phase of the voltage of the second signal.

The phase error signal can represent a signal path delay of the first signal path. The signal path delay can be converted to a digital representation of the signal path delay.

Outputting the signal path delay can include storing the signal path delay. The signal path delay can also be output to a processor.

The method of determining the in-situ signal path delay can also include multiple iterations of determining the in-situ signal path delay. A signal path delay can be stored for each of the iterations of determining the in-situ signal path delay. Multiple dynamic conditions of the integrated circuit can also be monitored. The multiple signal path delays can be correlated to the dynamic conditions of the integrated circuit.

A component of the first signal path can be adjusted so as to adjust the signal path delay.

Another embodiment includes a system for determining an in-situ signal path delay in an integrated circuit. The system includes a first signal path having a first input node and a first output node and a reference signal path having a second input node and a second output node. An integrator having a first input coupled to the first output node and a second input coupled to the second output node is also included.

The first signal path and the reference signal path can have the same physical length. An analog to digital converter can be coupled to an output of the integrator. A storage medium can be coupled to an output of the integrator. A processor can also be coupled to an output of the integrator.

Yet another embodiment includes an integrated circuit that includes a first signal path having a first input node and a first output node and a reference signal path having a second input node and a second output node. An integrator having a first input coupled to the first output node and a second input coupled to the second output node is also included.

The integrated circuit can include a microprocessor. The integrated circuit can also include a dynamic temperature monitoring system. The integrated circuit can also include multiple signal paths. The integrated circuit can also include adjustable components in each of the signal paths. The adjustable components can be adjusted so as to minimize a clock signal guard band.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for providing a system and method of measuring signal path delays in-situ will now be described. It will be apparent to those skilled in the art that the present invention may be practiced without some or all of the specific details set forth herein.

Integrated circuits can include many signal paths. For example a microprocessor can include signal paths between a processing core and an internal register and between the internal register and an I/O buffer and many other signal paths. Signal path delays must be quantified so as to ensure that the signal levels on the signal path can be accurately detected. One embodiment of the present invention provides a circuit included within the integrated circuit that can accurately quantify a signal delay for a signal path in-situ.

Figure 1A:
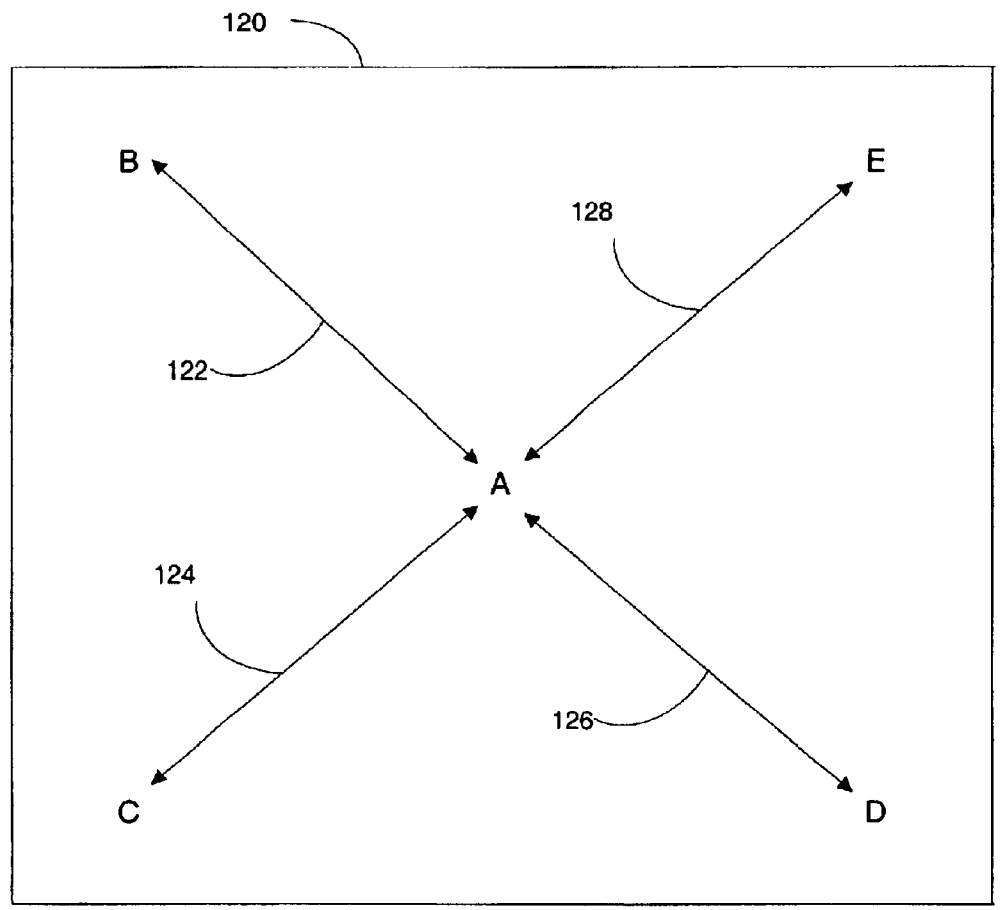
FIG. 1A shows a typical microprocessor.
Figure 1B:
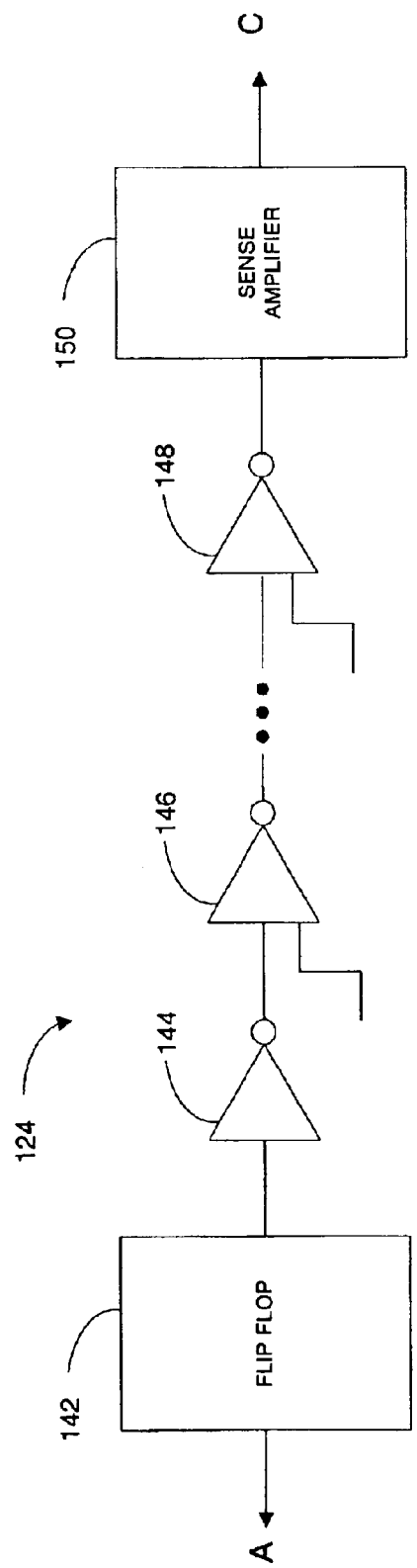
FIG. 1B is a schematic of the signal path.
Figure 2A:
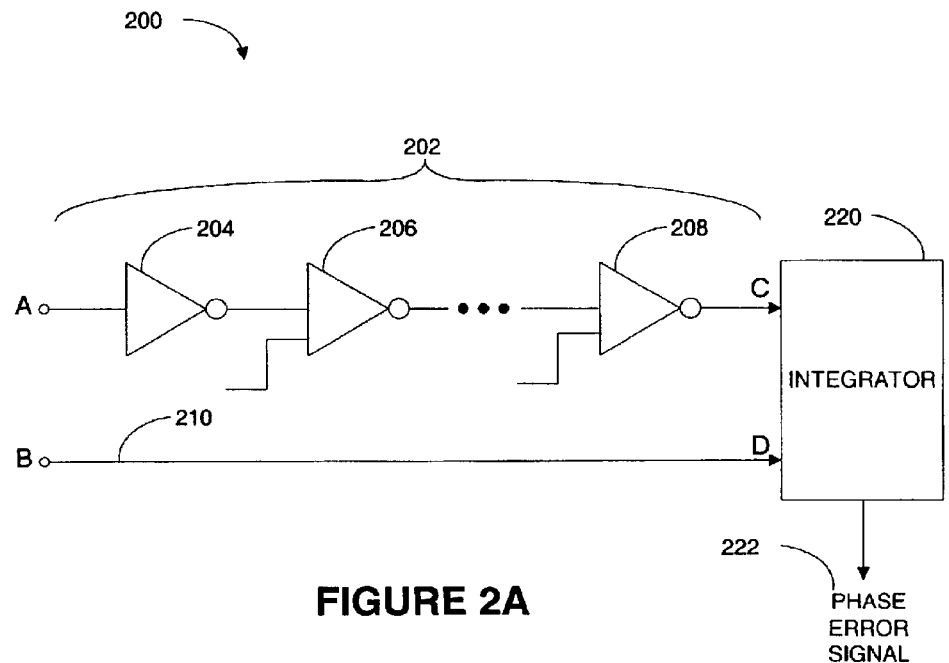
FIG. 2A is a schematic diagram of an in-situ signal path delay measurement circuit in accordance with one embodiment of the present invention.

FIG. 2A is a schematic diagram of an in-situ signal path delay measurement circuit 200 in accordance with one embodiment of the present invention. The in-situ signal path delay measurement circuit 200 includes a signal path 202 and a reference path 210. The signal path 202 includes multiple intermediate stages 204, 206, 208 (e.g., logic gates, sense amplifiers, etc.) such as are typically included within a signal path. The signal path 202 can have any number of intermediate stages 204, 206, 208. The signal path 202 and the reference path 210 are coupled to two inputs of an integrator 220. The signal path 202 and the reference path 210 have substantially the same physical length.

Figure 2B:
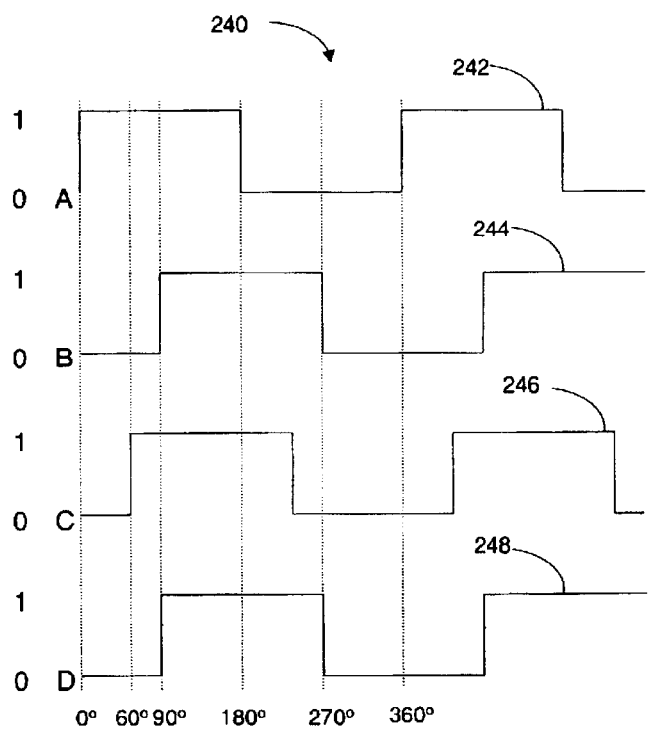
FIG. 2B is a graph of data signals that pass through the in-situ signal path delay measurement circuit, in accordance with one embodiment of the present invention.

FIG. 2B is a graph 240 of data signals that pass through the in-situ signal path delay measurement circuit 200, in accordance with one embodiment of the present invention. Data signal 242 is input at node A of the signal path 202. Data signal 246 is the resulting data signal measured at node C at the output of the signal path 202. Data signal 244 is input at node B of the reference path 210. Data signal 248 is the resulting data signal measured at point D at the output of the reference path 210. Data signal 242 and data signal 244 have substantially the same amplitude and frequency. Data signal 244 is input at a known (or selected) time delay (i.e., phase shift) from data signal 242. As shown, the known or selected time delay is 90-degrees and therefore data signal 244 is phase shifted about 90-degrees from data signal 242.

If there were zero signal delay in the signal path 202, then data signal 248 would also lag data signal 246 by about 90-degrees. However, as shown, data signal 246 lags data signal 242 by about 60-degrees. This 60-degree phase shift is caused by the signal delay occurring in the signal path 202. Conversely, data signal 248 is substantially the same (i.e. not phase shifted) as data signal 244 because the reference path 210 has substantially zero signal delay between nodes B and D. Graph 240 shows the data signals 242, 244, 246 and 248 adjusted to correct for any delay caused by the physical length of the signal path 202 and reference path 210 because signal path 202 and reference path 210 have the same physical length. The 60-degree phase shift shown in the data signal 246 may not be illustrated to scale so as to aid in illustrating the various embodiments of the present invention.

The integrator 220 compares the data signals 246, 248 and outputs a phase error signal 222. A phase error signal 222 corresponding to data signal 248 lagging data signal 246 by the known time delay (e.g., 90-degrees) would indicate substantially zero signal delay in the signal path 202. As shown in FIG. 2B, data signal 248 lags data signal 246 by only about 30-degrees, therefore the resulting phase error signal 222 corresponds to the 30-degree phase shift. The phase error signal 222 can be based upon a voltage or a current of the compared data signals 246, 246.

Figure 3:
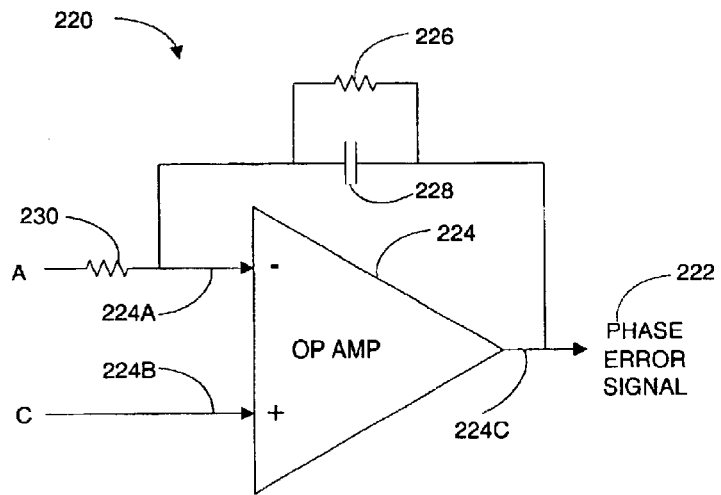
FIG. 3 shows a schematic of an integrator in accordance with one embodiment of the present invention.

FIG. 3 shows a schematic of an integrator 220 in accordance with one embodiment of the present invention. The integrator 220 includes an amplifier 224 having two inputs: negative input 224A and positive input 224B. A feedback capacitor 228 is coupled between the output 224C and the negative input 224A. A load resistor 230 is coupled in series between the negative input 224A and a first input (e.g., node A shown in FIG. 2A above). A second input (e.g., node C shown in FIG. 2A above) is coupled to the positive input 224B.

Operational analysis of the integrator 220 is straightforward. If, at a time t0, the voltage across the feedback capacitor 228 is zero, then the output voltage is a function of time (t) is given by the following Relationship 1:

$$v_o = V_{os} + (V_{os}/CR)t \qquad \text{Relationship 1}$$

Thus $v_o$ increases linearly with time until the amplifier 224 saturates. Adding the resistor 226 with a resistance $R_f$ in parallel with the capacitor 228 provides a dc path through which the dc current ($V_{os}/R$) can flow. As a result, $v_o$ will now have a dc component of $V_{os}[1+(R_f/R)]$ instead of rising linearly. A relatively low value for $R_f$ will maintain a corresponding small dc offset voltage at the output.

In operation, the phases of the voltage signals on the negative input 224A and the positive input 224B are compared and a phase error signal 222 is output from the output 224C. The phase error signal 222 can be calibrated to determine the phase difference between the signal path 202 and reference path 210. The phase difference can then be used to determine an actual signal path delay such as by comparing the actual phase difference to a known phase difference that corresponds to the selected phase shift between the signals 242, 244.

While the phase of the voltage aspect of the signals 242, 244, 246 and 248 are compared above, it should be understood that other aspects (e.g., current) could similarly be used to determine the phase error signal 222.

Figure 4:
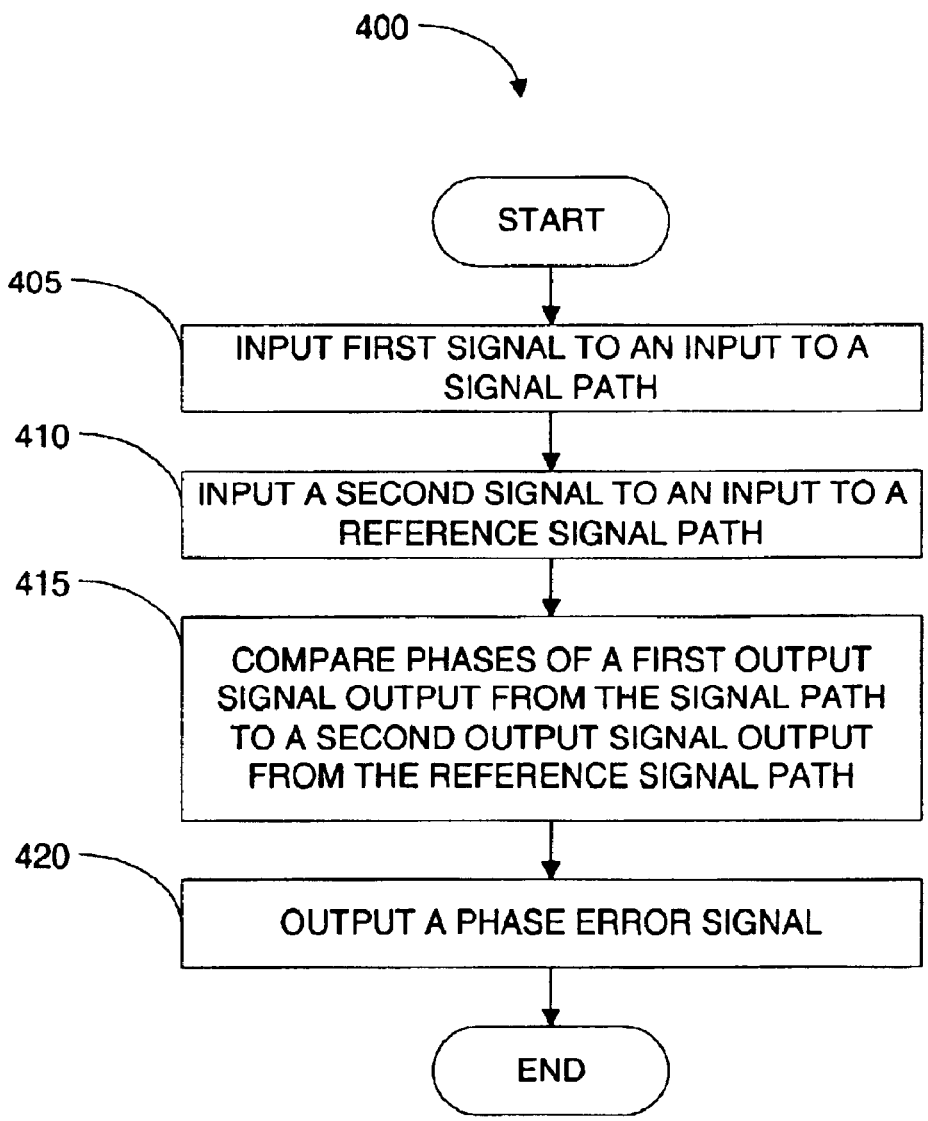
FIG. 4 is a flowchart diagram of the method operations for an in-situ determination of a signal path delay in accordance with one embodiment of the present invention.

FIG. 4 is a flowchart diagram of the method operations 400 for an in-situ determination of a signal path delay in accordance with one embodiment of the present invention. In operation 405, a first signal 242 is input to an input to a first signal path such as signal path 202 described above. In operation 410, a second signal 244 is input to a reference signal path that is substantially the same physical length as the first signal path such as reference signal path 210 described above. In operation 415, the phase of a first output signal 246 that is output from the first signal path 202, is compared to the phase of a second output signal 248 that is output from the reference signal path 210. A comparator device such as an integrator can compare the phases of the first and second output signals. In operation 420, a phase error signal 222 is produced and the method operations end. The phase error signal 222 can be used to identify the signal path delay in the signal path 202.

Figure 5:
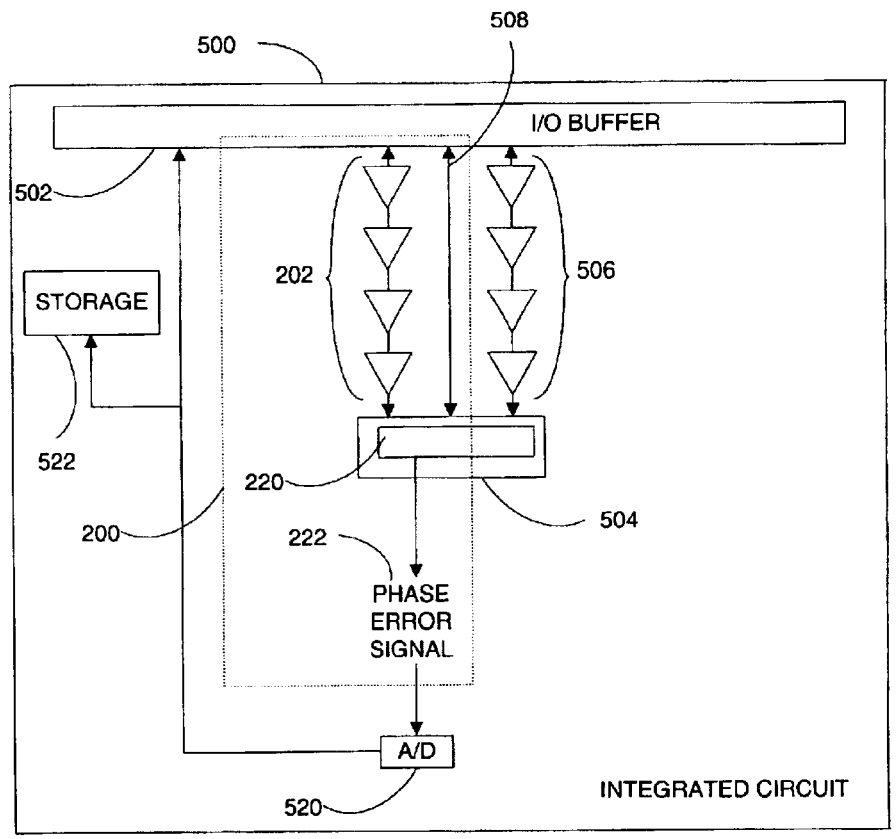
FIG. 5 is a block diagram of an integrated circuit that includes an in-situ signal path delay measurement circuit in accordance with one embodiment of the present invention.

FIG. 5 is a block diagram of an integrated circuit 500 that includes an in-situ signal path delay measurement circuit 200 in accordance with one embodiment of the present invention. The signal path delay measurement circuit 200 is located between an I/O buffer and a register 504 and measures the signal path delay in the signal path 202 and signal path 506 through use of reference signal path 508. The reference signal path 508 is substantially the same physical length as the signal path 202, 506. Integrator 220 is not limited to only two inputs as described in FIGS. 2A–4 above but rather can compare multiple inputs such as the signal path 202, signal path 506 and reference signal path 508. The Integrator 220 can determine corresponding phase error signals 222 for each of the signal path 202 and the signal path 506.

The corresponding phase error signals 222 can be output to an analog to digital converter 520 to create a digital representation of the phase error signals 222. The digital representations of the phase error signals 222 can be output from the integrated circuit 500 such as through the I/O buffer for external use and storage. Alternatively, the digital representations of the phase error signals 222 can also be stored on the integrated circuit 522 within a suitable storage 522. The storage can be any type of storage known in the art such as RAM, EEPROM, flash, or other types of suitable storage medium or combinations thereof.

Figure 6:
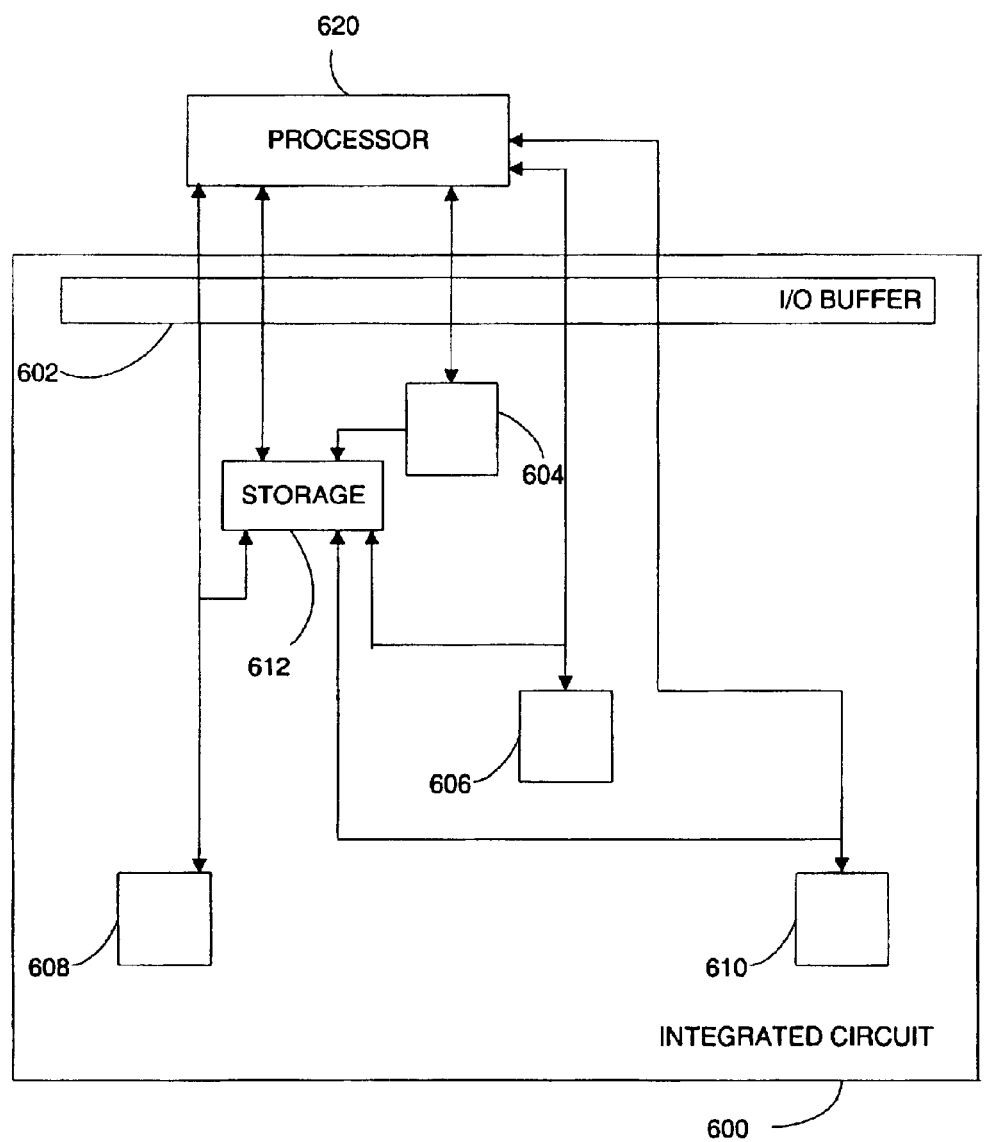
FIG. 6 is a block diagram of an integrated circuit that includes multiple in-situ signal path delay measurement circuits in accordance with one embodiment of the present invention.

FIG. 6 is a block diagram of an integrated circuit 600 that includes multiple in-situ signal path delay measurement circuits 604, 606, 608 and 610 in accordance with one embodiment of the present invention. Each of the multiple in-situ signal path delay measurement circuits 604, 606, 608 and 610 include the components of a in-situ signal path delay measurement circuit such as the in-situ signal path delay measurement circuit 200 shown in FIGS. 2A and 5 above. Each of the multiple in-situ signal path delay measurement circuits can be distributed around the integrated circuit 600.

In addition, each of the multiple in-situ signal path delay measurement circuits 604, 606, 608 and 610 can include an analog to digital converter. In an alternative, an analog to digital converter can be included as part of the storage 612 so that the storage can receive an analog phase error signal, digitize the analog phase error signal and store a resulting digital representation of the received analog.

The phase error signal, in analog or digital representation, or both, can also be output from the integrated circuit 600 to an external device such as a processor 620. The processor 620 can also be included as part of the integrated circuit 600. The processor 620 can be a maintenance processor capable of receiving and recording the phase error signal.

In one embodiment, the integrated circuit can also include a system for monitoring a temperature of an integrated circuit such as described in co-pending, commonly assigned U.S. patent application Ser. No. 10/079,476 filed on Feb. 19, 2002 and entitled "Method and System for Monitoring and Profiling IC Die Temperature," by inventors Spencer Gold, Claude Gauthier, Steven Boyle, Kenneth House and Joseph Siegel, which is incorporated herein by reference in its entirety. The system for monitoring and profiling IC die temperature can be combined with the system for determining a signal path delay to correlate dynamic temperature of a selected signal path with a determined signal path delay of the selected signal path.

Figure 7:
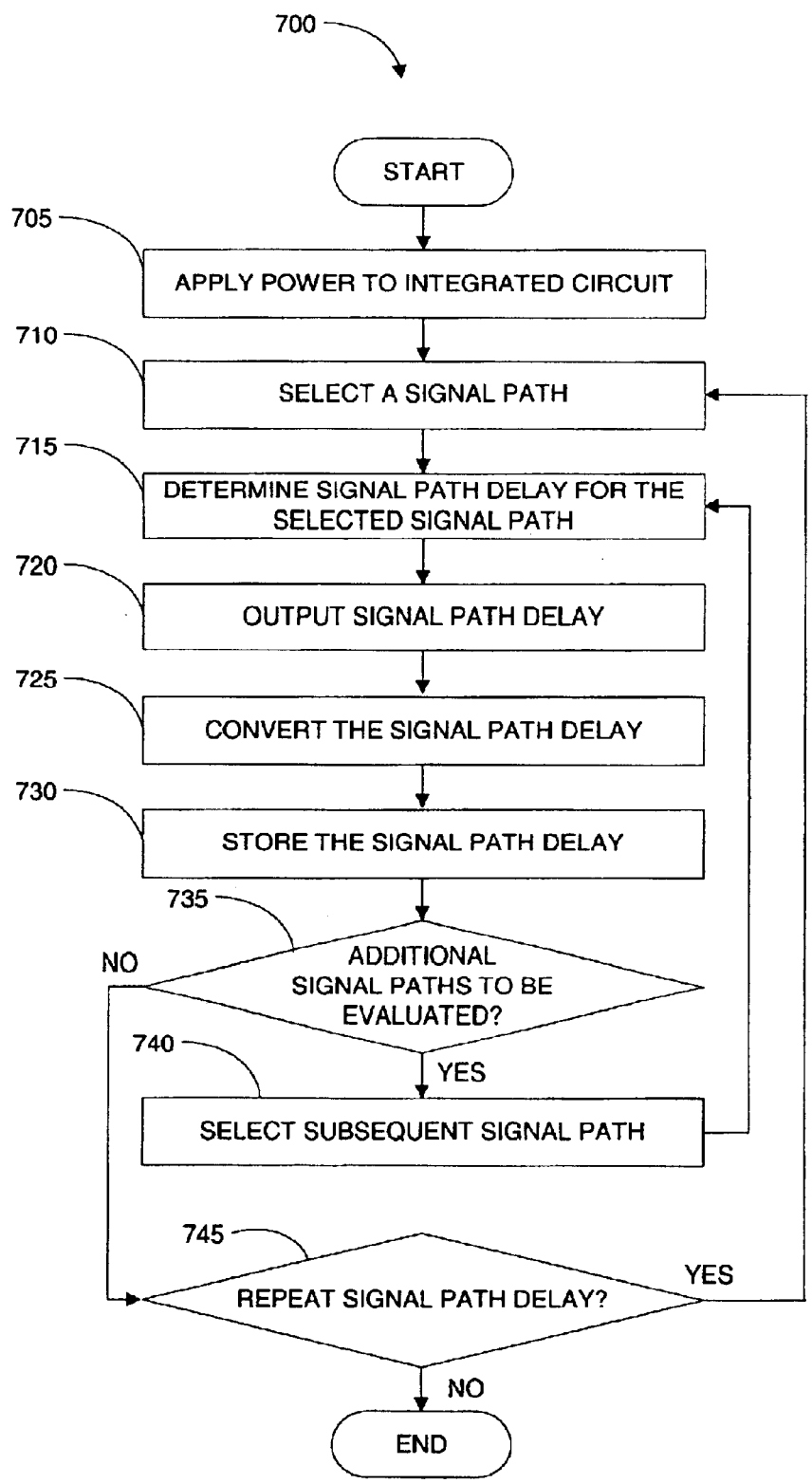
FIG. 7 is a flowchart diagram of the method operations 700 for an in-situ determination of a signal path delay in accordance with one embodiment of the present invention.

FIG. 7 is a flowchart diagram of the method operations 700 for an in-situ determination of a signal path delay in accordance with one embodiment of the present invention. In operation 705, power is applied to an integrated circuit (e.g., integrated circuit 500, 600 above) that includes an in-situ signal path delay measurement circuit (e.g., in-situ signal path delay measurement circuits 200, 604, 606, 608 and 610). In operation 710, signal path delay is selected. In operation 715, a signal path delay for the selected signal path is determined. The signal path delay can be determined as described in FIG. 4 above. In operation 720, the signal path delay is output and the method operations end. In an optional operation 725, a digital representation of the signal path delay is created. In an optional operation 730, the signal path delay can be stored. The signal path delay can be stored in storage (e.g., storage 522, storage 612 described in FIGS. 5 and 6 above). Alternatively, the signal path delay can be output to the processor 620. The processor 620 can store and use the signal path delay.

If, in optional operation 735 there are multiple signal paths to be evaluated for signal path delay, then in optional operation 740, a subsequent signal path is selected to be evaluated and the method operations continue in operation 715 as described above.

In one embodiment, the method operations for each signal path can be determined on a reiterative basis. By way of example in optional operation 745, if the signal path delay determination is to be repeated, then the method operations repeat beginning with operation 710 as described above. Alternatively, if the signal path delay determination is not to be repeated, then the method operations end. By way of example, the signal path delay for each of the signal paths can be determined periodically so that the output signal path delay can accurately reflect any dynamic changes (e.g., temperature, voltage, etc.) that may cause a change in the determined signal path delay for each signal path.

Accurately determining the signal path delay for each of the signal paths can allow the signal paths to be paired or grouped, by a selected signal path delay so that the grouped signal paths have the same signal path delay and therefore require a minimal guard band in the clock signal. A minimal guard band allows for a maximized clock frequency, thereby allowing an overall higher signal frequency and throughput for the signal path.

An accurate, dynamic measurement of the signal path delay for each of the signal paths can also allow for adjustment and manipulation of the components within each of the signal paths so as to minimize any differences in signal path delay between the signal paths. By way of example, a microprocessor can include an in-situ signal path delay measurement circuit for each signal path or set of signal paths within the microprocessor. The in-situ signal path delay measurement circuits can determine the accurate, dynamic measurement of the signal path delay for each of the signal paths. If the signal path delay for each of the signal paths is known, then a slow-type signal path can be adjusted so as to switch faster. By way of example the bias voltage of the components of the slow-type signal path can be increased so that the components in the slow-type signal path the signal paths will switch faster. In one embodiment, the processor 620 can manipulate the components of the integrated circuit 600 so as to minimize differences in signal path delay for each of the signal paths on the integrated circuit.

As used herein in connection with the description of the invention, the term "about" means +/−10%. By way of example, the phrase "about 90 degrees" indicates a range of between 81 and 99 degrees. It will be further appreciated that the instructions represented by the operations in FIGS. 4 and 7 are not required to be performed in the order illustrated, and that all the processing represented by the operations may not be necessary to practice the invention. Further, the processes described in FIGS. 4 and 7 can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of determining an in-situ signal path delay on an integrated circuit comprising:
    inputting a first signal to a first input node of a first signal path;
    inputting a second signal to a second input node of a reference signal path, wherein the first signal path and the reference signal path have substantially the same physical length;
    comparing a phase of the first signal output from a first output node of the first signal path and a phase of the second signal output from a second output node of the reference signal path, wherein the phase of the first signal and the phase of the second signal are compared in an integrator, the integrator being included in the integrated circuit, the integrator including:
        an amplifier having a negative input, a positive input and an integrator output, the second input coupled to the second output node;
        a feedback device coupled between the integrator output and the negative input; and
        a load coupled in series between the negative input and the first output node; and
    outputting a phase error signal from the integrator output.

2. The method of claim 1, wherein comparing the phase of the first signal output from the first output node of the first signal path and the phase of the second signal output from the second output node of the reference signal path includes comparing a phase of the voltage of the first signal and a phase of the voltage of the second signal.

3. The method of claim 1, wherein the phase error signal represents a signal path delay of the first signal path.

4. The method of claim 3, further comprising converting the signal path delay to a digital representation of the signal path delay.

5. The method of claim 3, wherein outputting the signal path delay includes storing the signal path delay.

6. The method of claim 3, wherein outputting the phase error signal includes outputting the signal path delay to a processor.

7. The method of claim 1, further comprising a plurality of iterations of determining the in-situ signal path delay.

8. The method of claim 7, further comprising storing a signal path delay for each of the plurality of iterations of determining the in-situ signal path delay.

9. The method of claim 8, further comprising monitoring a plurality of dynamic conditions of the integrated circuit.

10. The method of claim 9, further comprising correlating the plurality of signal path delays to the plurality of dynamic conditions of the integrated circuit.

11. The method of claim 1, further comprising adjusting an control input on a component of the first signal path so as to modify a switching speed of the component so as to adjust the signal path delay in the first signal path.

12. A system for determining an in-situ signal path delay in an integrated circuit comprising:
- a first signal path having a first input node and a first output node;
- a reference signal path having a second input node and a second output node, wherein the first signal path and the reference signal path have substantially the same physical length; and
- an integrator having a first input coupled to the first output node and a second input coupled to the second output node, the integrator including:
  - an amplifier having a negative input, a positive input and an integrator output, the second input coupled to the second output node;
  - a feedback device coupled between the integrator output and the negative input; and
  - a load coupled in series between the negative input and the first output node.

13. The system of claim 12, further comprising an analog to digital converter coupled to an output of the integrator.

14. The system of claim 12, further comprising a storage medium coupled to an output of the integrator.

15. The system of claim 12, further comprising a processor coupled to an output of the integrator.

16. An integrated circuit comprising:
- a first signal path having a first input node and a first output node;
- a reference signal path having a second input node and a second output node, wherein the first signal path and the reference signal path have substantially the same physical length; and
- an integrator having a first input coupled to the first output node and a second input coupled to the second output node, the integrator including:
  - an amplifier having a negative input, a positive input and an integrator output, the second input coupled to the second output node;
  - a feedback device coupled between the integrator output and the negative input; and
  - a load coupled in series between the negative input and the first output node.

17. The integrated circuit of claim 16, wherein the integrated circuit includes a microprocessor.

18. The integrated circuit of claim 16, further comprising a dynamic temperature monitoring system.

19. The integrated circuit of claim 16, further comprising a plurality of signal paths.

20. The integrated circuit of claim 19, further comprising an adjustable component in each of the plurality of signal paths wherein the adjustable component includes a control input having a variable control signal applied thereto, the variable control signal correspondingly varying a switching speed of the component so as to minimize a clock signal guard band.

* * * * *